(12) United States Patent
Kris

(10) Patent No.: US 8,432,208 B2
(45) Date of Patent: Apr. 30, 2013

(54) MAINTAINING PULSE WIDTH MODULATION DATA-SET COHERENCY

(75) Inventor: Bryan Kris, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 35 days.

(21) Appl. No.: 13/247,636

(22) Filed: Sep. 28, 2011

(65) Prior Publication Data

US 2013/0076417 A1    Mar. 28, 2013

(51) Int. Cl.
*H03K 3/017* (2006.01)
*H03K 9/08* (2006.01)
*H03K 7/08* (2006.01)

(52) U.S. Cl.
USPC ............ 327/176; 327/172; 327/175; 327/31; 332/109; 332/110

(58) Field of Classification Search .................. 327/172, 327/175, 176, 31–38; 332/109, 110; 375/238
See application file for complete search history.

(56) References Cited

U.S. PATENT DOCUMENTS

| | | | | |
|---|---|---|---|---|
| 5,726,657 | A * | 3/1998 | Pergande et al. | 342/202 |
| 7,307,461 | B2 * | 12/2007 | Nguyen et al. | 327/172 |
| 7,433,404 | B2 * | 10/2008 | Kris | 375/238 |
| 7,508,899 | B2 * | 3/2009 | Kris | 375/376 |
| 7,508,901 | B2 * | 3/2009 | Kris | 375/376 |
| 7,646,808 | B2 * | 1/2010 | Kris et al. | 375/238 |
| 7,683,597 | B2 * | 3/2010 | Shimada et al. | 323/283 |
| 7,714,626 | B2 * | 5/2010 | Kris | 327/175 |
| 7,737,745 | B2 * | 6/2010 | You | 327/158 |
| 7,791,386 | B2 * | 9/2010 | Kris | 327/160 |

* cited by examiner

*Primary Examiner* — Lincoln Donovan
*Assistant Examiner* — Afework Demisse
(74) *Attorney, Agent, or Firm* — King & Spalding L.L.P.

(57) ABSTRACT

Multi-phase, frequency coherent pulse width modulation (PWM) signals are generated that maintain PWM data-set coherency regardless of user or system events. PWM data-set coherency is accomplished by adding data buffers to hold and transfer new PWM data during a data-set update from a processor. After the data-set transfer to the data buffers is complete and when the next PWM cycle is about to start, the data-set stored in the data buffers is transferred to the active PWM registers in time for the start of the next PWM cycle.

20 Claims, 4 Drawing Sheets

MAINTAINING PULSE WIDTH MODULATION DATA-SET COHERENCY

TECHNICAL FIELD

The present disclosure relates generally to generation of pulse width modulation (PWM) signals, and more particularly to maintaining PWM data-set coherency.

BACKGROUND

As digital switch mode power supply (SMPS) power conversion applications become ever more sophisticated, the number of PWM output used in an application are rapidly increasing. Also the parameters that define each PWM output signal are increasing and now include duty cycle, period, phase offset, and dead-time. Also the rate at which all of this data needs to be updated is increasing. The net result is that a very large number of data values must be computed and transferred from the processor to the PWM peripheral in a limited amount of time. Therefore, a problem exists in that it is becoming more difficult to insure that all of the required data that defines a PWM signal data set is transferred into the PWM controller before the start of the next PWM cycle. If the data transfers over a PWM cycle boundary, the behavior of the PWM module may become unpredictable.

SUMMARY

Therefore, what is needed is a way to generate multi-phase, frequency coherent pulse width modulation (PWM) signals that maintain PWM data-set coherency regardless of user or system events. PWM data-set coherency is accomplished, according to the teachings of this disclosure, by adding data buffers to hold and transfer new PWM data during a data-set transfer from a digital processor. After the data-set transfer to the data buffers is complete and when the next PWM cycle is about to start, the data-set stored in the data buffers is transferred to the active PWM registers in time for the start of the next PWM cycle.

A flip-flop and associated logic controls the transfer of the PWM data from the data buffers to the active PWM data registers (e.g., period, duty-cycle, phase-offset, etc.). The flip-flop is set by the application software when the processor has transferred all of the data. After the processor has set the flip-flop, and when the start of the new PWM cycle is about to begin, the set output of the flip-flop is enabled through an AND gate to command the transfer of the data-set from the data buffers to the active PWM registers. Once the actual data-set transfer is complete, the flip-flop is cleared.

According to a specific example embodiment of this disclosure, a pulse width modulation (PWM) generator (302) for generating a phase shifted PWM signal (350) that is synchronized with a master time base (300) and maintains PWM data-set coherency comprises: a duty cycle register (310) storing a duty cycle value; a duty cycle counter (314) having a clock input coupled to a clock generating a plurality of clock pulses and incrementing a duty cycle count value for each of the plurality of clock pulses received; a duty cycle comparator (312) coupled to the duty cycle register (310) and the duty cycle counter (314), wherein the duty cycle comparator (312) compares the duty cycle count value to the duty cycle value and generates a PWM signal (350) when the duty cycle count value is less than or equal to the duty cycle value; a phase offset register (316) storing a phase offset value and coupled to the duty cycle counter (314), wherein the phase offset value is loaded into the duty cycle counter (314) to become a new duty cycle count value when a PWM cycle start signal (348) is asserted from a master time base (300); a duty cycle buffer register (320) coupled to the duty cycle register (310), wherein the duty cycle buffer register (320) stores a new duty cycle value; a phase offset buffer register (318) coupled to the phase offset register (316), wherein the phase offset buffer register (318) stores a new phase offset value; and logic for generating a new data-set signal (332) just before starting a next PWM cycle; wherein the new duty cycle value replaces the duty cycle value and the new phase offset value replaces the phase offset value when the new data-set signal (332) is asserted.

According to another specific example embodiment of this disclosure, a system for generating a plurality of pulse width modulation (PWM) signals (350) that are synchronized with a master time base (300) and maintain PWM data-set coherency comprises: a master time base generator (300), wherein the master time base generator (300) comprises: a master period register (304) storing a master period value; a master period counter (308) having a clock input coupled to a clock generating a plurality of clock pulses, and incrementing a master count value for each of the plurality of clock pulses received; a master period comparator (306) coupled to the master period register (304) and the master period counter (308), wherein the master period comparator (306) compares the master count value to the master period value, generates a PWM cycle start signal (348) when the master count value is equal to or greater than the master period value, and then resets the master count value in the master period counter (308) to zero; and a plurality of PWM generators (302) for generating a plurality of PWM signals (350) that are synchronized with the PWM cycle start signal (348) and maintain PWM data-set coherency, each of the plurality of PWM generators (302) comprises: a duty cycle register (310) storing a duty cycle value; a duty cycle counter (314) having a clock input coupled to the clock and incrementing a duty cycle count value for each of the plurality of clock pulses received; a duty cycle comparator (312) coupled to the duty cycle register (310) and the duty cycle counter (314), wherein the duty cycle comparator (312) compares the duty cycle count value to the duty cycle value, and generates a phase offset related PWM signal (350) when the duty cycle count value is less than or equal to the duty cycle value; a phase offset register (316) storing a phase offset value and coupled to the duty cycle counter (314), wherein the phase offset value is loaded into the duty cycle counter (314) to become a new duty cycle count value when the PWM cycle start signal (348) is asserted from the master time base (300); a duty cycle buffer register (320) coupled to the duty cycle register (310), wherein the duty cycle buffer register (320) stores a new duty cycle value; a phase offset buffer register (318) coupled to the phase offset register (316), wherein the phase offset buffer register (318) stores a new phase offset value; a master period buffer register (322) coupled to the master period register (304), wherein the master period buffer register (322) stores a new master period value; and logic for generating a new data-set signal (332) just before starting a next PWM cycle; wherein the new master period value replaces the master period value in the master period register (304), and the new duty cycle value replaces the duty cycle value and the new phase offset value replaces the phase offset value in each of the plurality of PWM generators (302) when the new data-set signal (332) is asserted.

According to yet another specific example embodiment of this disclosure, a method for generating a plurality of pulse width modulation (PWM) signals that are synchronized with a master time base and maintain PWM data-set coherency, said method comprises the steps of: storing a master period value in a master period register (304); incrementing a master count value in a master period counter (308) for each clock pulse received by the master period counter (308); comparing the master count value to the master period value with a master period comparator (306); generating a PWM cycle start signal when the master count value is equal to or greater than the master period value and then resetting the master count value to zero; synchronizing a plurality of PWM generators (302) with the PWM cycle start signal, wherein each of the plurality of PWM generators (302) generates a PWM signal that is synchronized with the PWM cycle start signal and maintains PWM data-set coherency, operation of each of the plurality of PWM generators (302) comprises the steps of: storing a duty cycle value in a duty cycle register (310); incrementing a duty cycle count value in a duty cycle counter (314) for each clock pulse is received by the duty cycle counter (314); comparing the duty cycle count value to the duty cycle value with a duty cycle comparator (312); generating a phase offset related PWM signal when the duty cycle count value is less than or equal to the duty cycle value; storing a phase offset value in a phase offset register (316); loading the phase offset value into the duty cycle counter (314) upon receiving the PWM cycle start signal, wherein the loaded phase offset value becomes a new duty cycle count value; storing a new duty cycle value in a duty cycle buffer register (320); storing a new phase offset value in a phase offset buffer register (318); storing a new master period value in a master period buffer register (322); generating a new data-set signal just before starting a next PWM cycle; replacing the duty cycle value with the new duty cycle value and the phase offset value with the new phase offset value in each of the plurality of PWM generators (302) when the new data-set signal is asserted; and replacing the master period value with the new master period value when the new data-set signal is asserted.

BRIEF DESCRIPTION OF THE DRAWINGS

A more complete understanding of the present disclosure thereof may be acquired by referring to the following description taken in conjunction with the accompanying drawings wherein.

Figure 1:
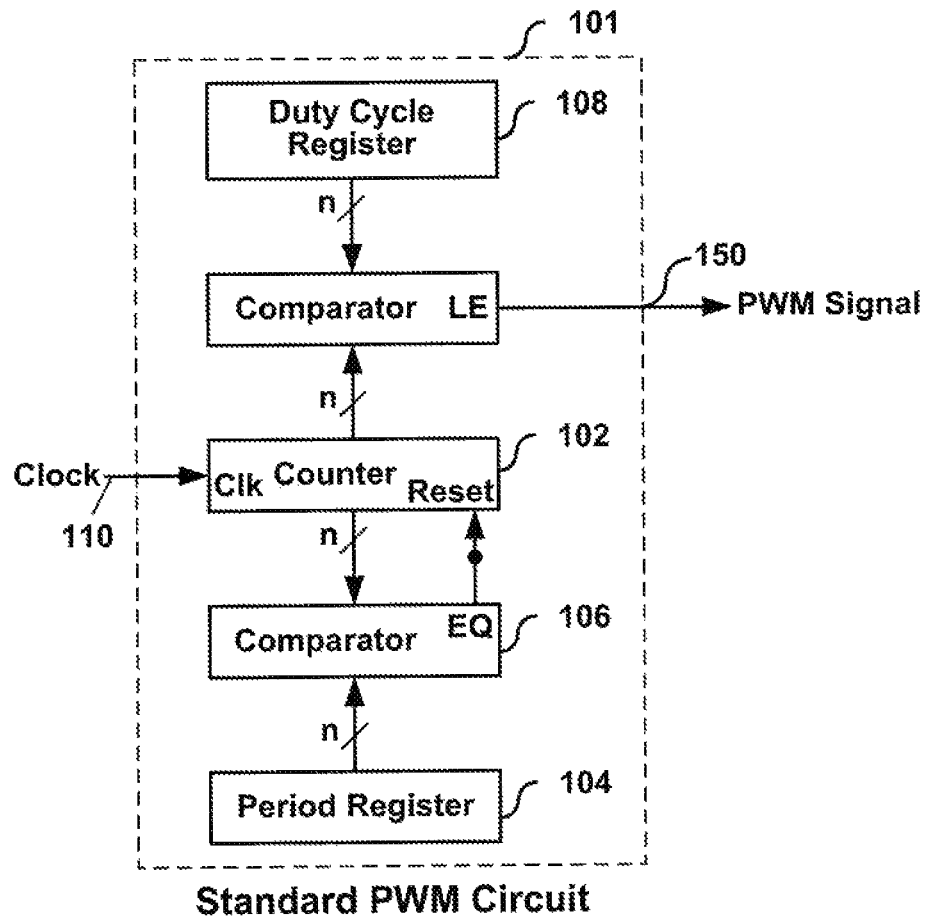
FIG. 1 illustrates a typical pulse width modulation (PWM) generator circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a typical pulse width modulation (PWM) generator circuit. The PWM generator circuit 101 comprises a timer/counter 102, a period register 104, a comparator 106 and a duty cycle register 108. The timer/counter 102 counts up from zero until it reaches a value specified by the period register 104 as determined by the comparator 106. The period register 104 contains a user specified value which represents the maximum counter value that determines the PWM period. When the timer/counter 102 matches the value in the period register 104, the timer/counter 102 is cleared by a reset signal from the comparator 106, and the cycle repeats. The duty cycle register 108 stores the user specified duty cycle value. A PWM output signal 120 is asserted (driven high) whenever the timer/counter 102 value is less than the duty cycle value stored in the duty cycle register 108. The PWM output signal 120 is de-asserted (driven low) when the timer/counter value 102 is equal to or greater than the duty cycle value stored in the duty cycle register 108.

Figure 2:
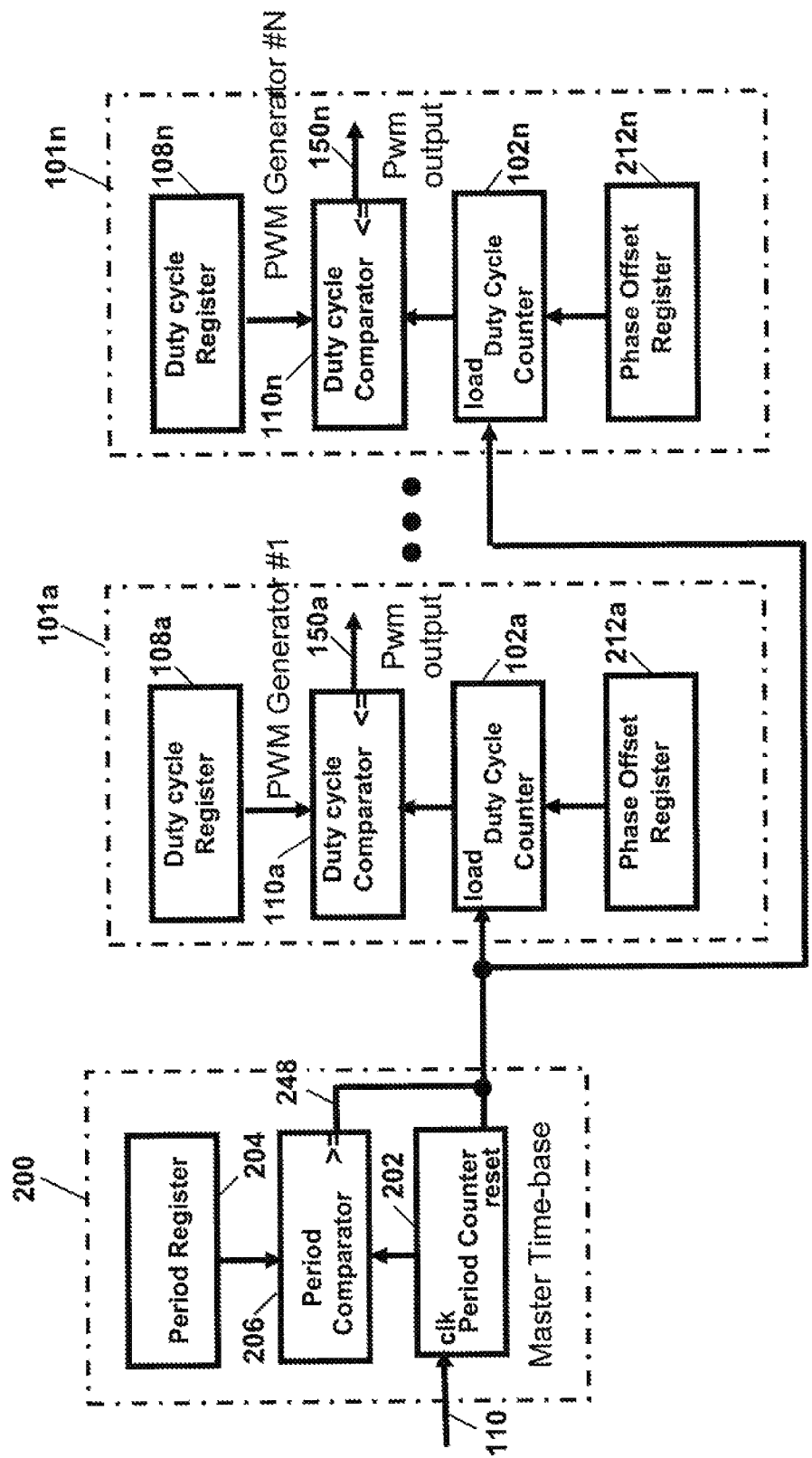
FIG. 2 illustrates a schematic block diagram of a multiphase PWM signal generation circuit having a master time-base and used for generating groups of synchronized PWM signals having phase offsets between each of the PWM signals.

Referring to FIG. 2, depicted is a schematic block diagram of a multiphase PWM signal generation circuit having a master time-base and is used for generating groups of synchronized PWM signals having phase offsets between each of the PWM signals. The multiphase PWM generation circuit comprises a master time-base 200 and a plurality of PWM generators 101. The master time-base 200 comprises a period register 204, period comparator 206 and a period counter 202 that control the period of each of the PWM signals from the PWM generators 101a-101n. Each of the PWM generators 101 comprises a phase offset register 212 that is used to determine the phase offset of the respective PWM output signal from each of the PWM generators 101. The PWM period register 204, duty cycle registers 108 and phase-offset registers 212 are programmed to values required to obtain a desired operating frequency (period), duty cycle and phase-offset, respectively, for each of the PWM generators 101. The local duty cycle counters 102 are synchronized to the master time-base 200 by a PWM cycle start signal 248 from the period comparator 206. The individual PWM signal outputs 150 may differ in phase (determined by the respective phase offset registers 212) but not in frequency (period) as determined by the contents of the period register 204. Clock inputs to duty cycle counters 102 are not shown for simplification of the schematic block diagram.

Figure 3:
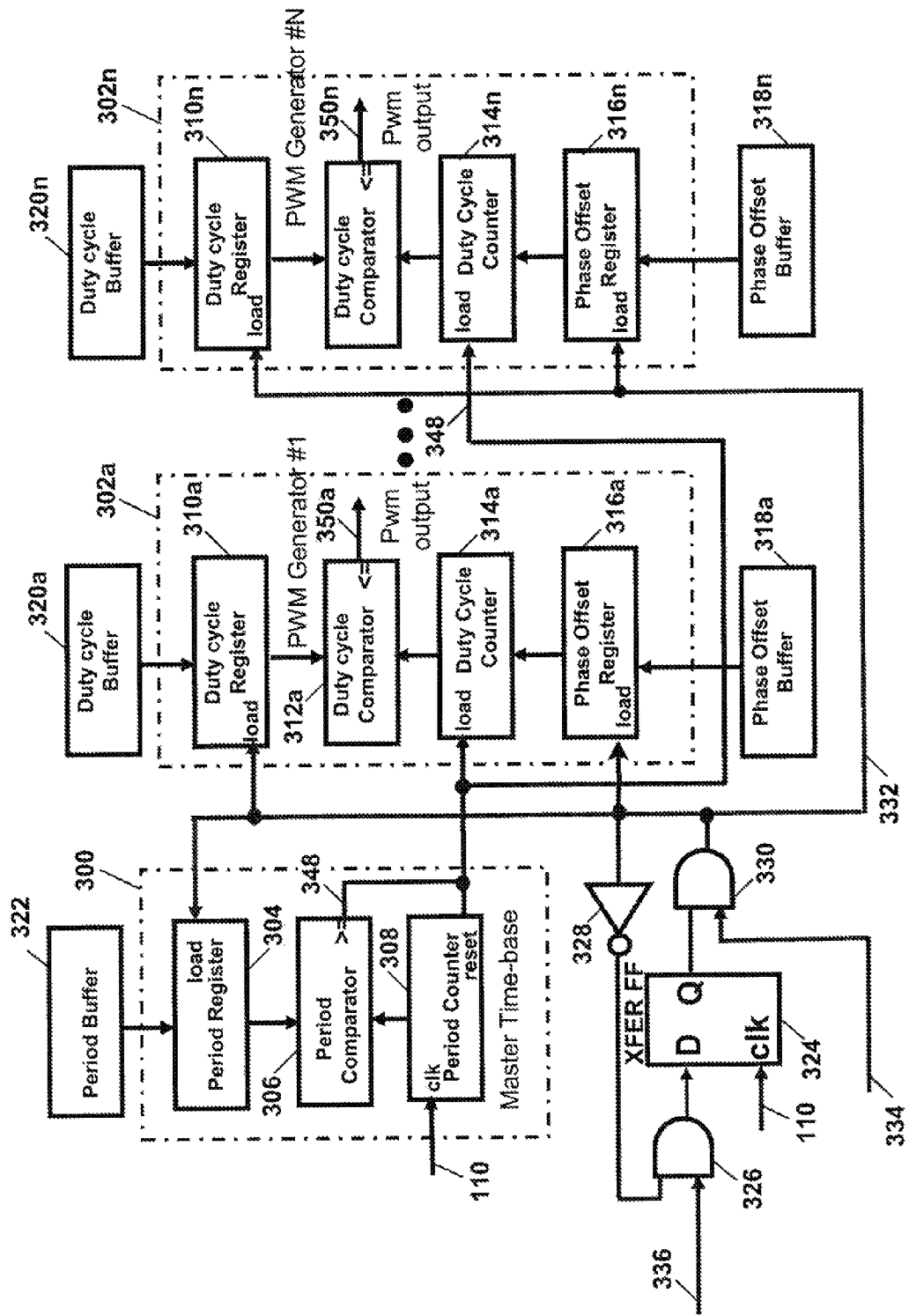
FIG. 3 illustrates a schematic block diagram of a multiphase PWM signal generation circuit having data buffers and associated control logic to maintain PWM data-set coherency during a change thereof and in time for the start of the next PWM cycle, according to a specific example embodiment of this disclosure.

Referring to FIG. 3, depicted is a schematic block diagram of a multiphase PWM signal generation circuit having data buffers and associated control logic to maintain PWM data-set coherency during a change thereof and in time for the start of the next PWM cycle, according to a specific example embodiment of this disclosure. A master time-base 300 comprises a period register 304, period comparator 306 and a period counter 308 that control the period of each of the PWM signals from the PWM generators 302a-302n. A period buffer register 322 is added to the master time-base 300 and is coupled to the period register 304. The period buffer register 322 stores a new period value for the PWM period and that new period value is transferred to the period register 304 when a load new data-set signal 332 is asserted at the load input of the phase offset register 316.

Each of the PWM generator circuits 302 comprises a phase offset register 316 that is used to determine the phase offset of a respective PWM output 350 from each of the PWM generators 302. The duty cycle and phase-offset PWM registers 310 and 316, respectively, are programmed to values required to obtain a desired duty cycle and phase-offset for each of the PWM outputs 350. The duty cycle counters 314 are synchronized to the master time-base 300 by a PWM cycle start signal 348 from the period comparator 306. The individual PWM signal outputs 150 may differ in phase (determined by the respective phase offset registers 316) but not in frequency (period) as determined by the contents of the period register 304. A duty cycle buffer register 320 and a phase offset buffer register 318 are added to each of the PWM generators 302, and are coupled to the duty cycle register 310 and phase offset register 316, respectively. The duty cycle buffer register 320 stores a new duty cycle value for the PWM duty cycle and that new duty cycle value is transferred to the duty cycle register 310 when the load new data-set signal 332 is asserted at the load input of the duty cycle register 310. The phase offset buffer register 318 stores a new phase offset value for the PWM phase offset and that new phase offset value is transferred to the phase offset register 316 when the load new data-set signal 332 is asserted at the load input of the duty cycle register 310.

A flip-flop 324 and associate logic, e.g., AND gates 326 and 330 and inverter 328, may be used to generate the load new data-set signal 332 that controls the transfer of the PWM data-set from the buffer registers 322, 320 and 318 to the active PWM registers 304, 310 and 316, respectively (period, duty cycle, and phase offset). It is contemplated and within the scope of this disclosure that other combinations of logic functions may be used to produce the load new data-set signal 332, and that one having ordinary skill in designing digital logic circuits and the benefit of this disclosure would readily understand how to do so. When the buffer registers load complete signal 336 is at a logic low, the flip-flop 324 is reset, i.e., the Q-output is at a logic low, and the load new data-set signal 332 remains at a logic low. When the buffer registers load complete signal 336 is at a logic high, representing completion of a new data-set being loaded into the buffer registers 322, 320 and 318; the flip-flop 324 is set on the next clock pulse, i.e., Q-out is at a logic high, however, the load new data-set signal 332 remains at a logic low. Not until a new PWM cycle is about to begin will the begin new PWM cycle signal 334 be asserted at a logic high, thereby causing the AND gate 330 to assert the load new data-set signal 332 at a logic high. When the load new data-set signal 332 goes to a logic high, the new PWM data-set is transferred from the buffer registers 322, 320 and 318 to the active PWM registers 304, 310 and 316, respectively (period, duty cycle, and phase offset), and the flip-flop 324 is reset (logic low at the D input thereof) at the next clock pulse. When to assert the begin new PWM cycle signal 334 may be determined by monitoring the count value in the period counter 308. Alternatively, the logic state of the load new data-set signal 332 may be used to generate assertion of the new PWM cycle signal 334, e.g., the period register 304, duty cycle registers 310 and phase offset registers 316 are loaded at substantially the same time when there is a new PWM data-set available in the buffer registers 322, 320 and 318. The Clock inputs to counters 314 are not shown for simplification of the schematic block diagram.

Figure 4:
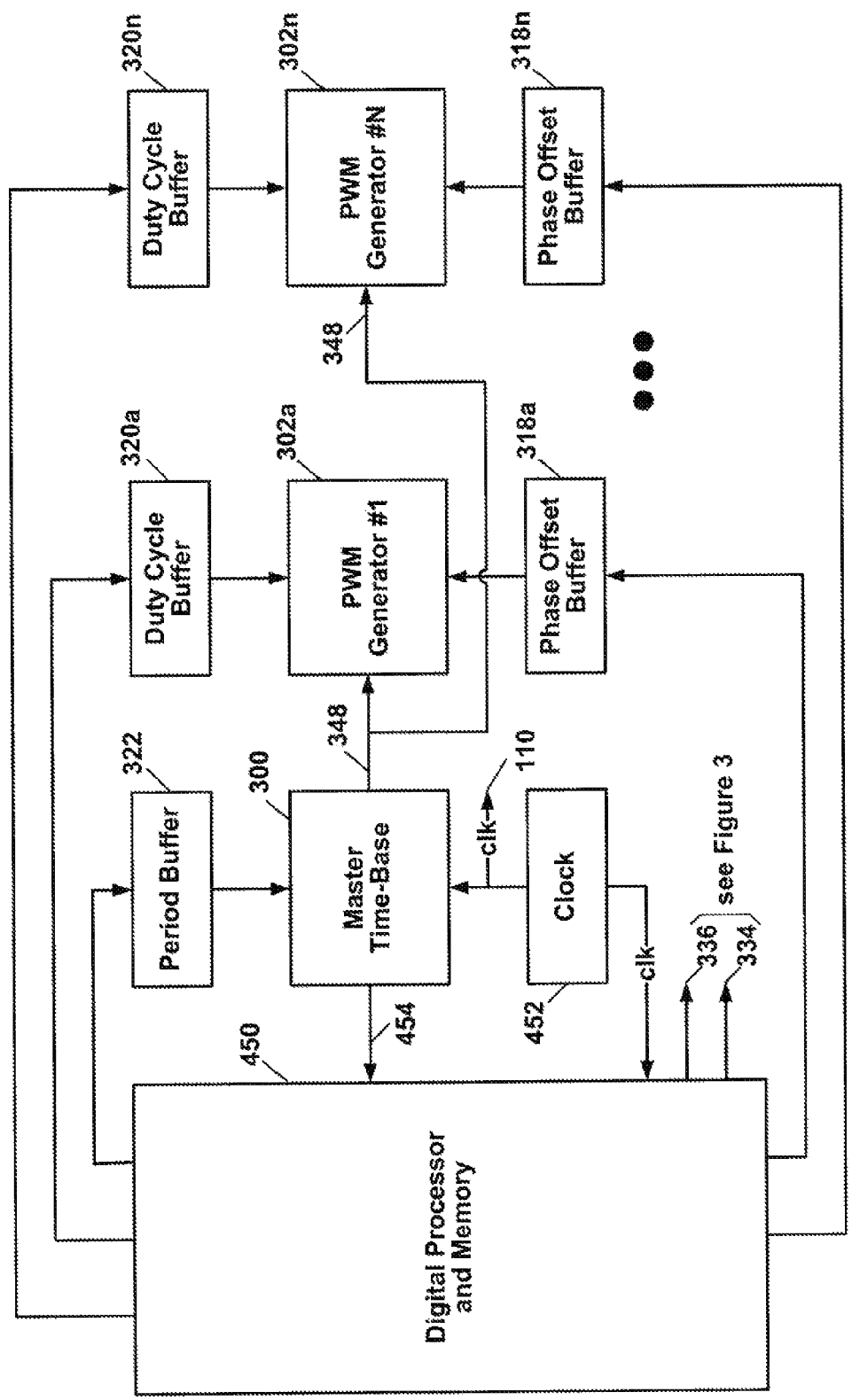
FIG. 4 illustrates a schematic block diagram of the multiphase PWM signal generation circuit of FIG. 3 coupled to a digital processor, according to the teachings of this disclosure.

Referring to FIG. 4, depicted is a schematic block diagram of the multiphase PWM signal generation circuit of FIG. 3 coupled to a digital processor, according to the teachings of this disclosure. A digital processor and memory 450 may send new PWM data-sets to the buffer registers 322, 320 and 318, generate the data-set load complete signal 336, and the begin new PWM cycle signal 334. The data-set load complete signal 336 and the begin new PWM cycle signal 334 may be initiated by application software running in the digital processor 450. The status of the master-time base 300 may be monitored by the digital processor and memory 450 over signal bus 454, e.g., period value in the counter 308, for determining when the new PWM cycle is about to begin. A clock 452 may have at least one clock output for driving the clock inputs of the master-time base 300, digital processor and memory 450, and the PWM generators 302. Clock inputs to counters 314 are not shown for simplification of the schematic block diagram. The digital processor may be, for example but is not limited to, a microcontroller, a microprocessor, a digital signal processor (DSP), etc., and may be a separate integrated circuit or be part of the same integrated circuit comprising the PWM generation circuits described hereinabove.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A pulse width modulation (PWM) generator (302) for generating a phase shifted PWM signal (350) that is synchronized with a master time base (300) and maintains PWM data-set coherency, comprising:

a duty cycle register (310) storing a duty cycle value;

a duty cycle counter (314) having a clock input coupled to a clock generating a plurality of clock pulses and incrementing a duty cycle count value for each of the plurality of clock pulses received;

a duty cycle comparator (312) coupled to the duty cycle register (310) and the duty cycle counter (314), wherein the duty cycle comparator (312) compares the duty cycle count value to the duty cycle value and generates a PWM signal (350) when the duty cycle count value is less than or equal to the duty cycle value;

a phase offset register (316) storing a phase offset value and coupled to the duty cycle counter (314), wherein the phase offset value is loaded into the duty cycle counter (314) to become a new duty cycle count value when a PWM cycle start signal (348) is asserted from a master time base (300);

a duty cycle buffer register (320) coupled to the duty cycle register (310), wherein the duty cycle buffer register (320) stores a new duty cycle value;

a phase offset buffer register (318) coupled to the phase offset register (316), wherein the phase offset buffer register (318) stores a new phase offset value; and logic for generating a new data-set signal (332) just before starting a next PWM cycle;

wherein the new duty cycle value replaces the duty cycle value and the new phase offset value replaces the phase offset value when the new data-set signal (332) is asserted.

2. The PWM generator according to claim 1, wherein the new data-set signal (332) is asserted when the PWM cycle start signal (348) is asserted from the master time base (300).

3. The PWM generator according to claim 1, wherein the logic for generating a new data-set signal (332) comprises:
  a first AND gate (326) having first and second inputs and an output, the first input is coupled to a data-set load complete signal (336);
  a D flip-flop (324) having a clock input coupled to the clock and a D-input coupled to the output of the first AND gate (326);
  a second AND gate (330) having a first input coupled to a Q-output of the D flip-flop (324), a second input coupled to a begin new PWM cycle signal (334) and an output for generating the new data-set signal (332); and
  an inverter having an input coupled to the output of the second AND gate (330) and an output coupled to the second input of the first AND gate (326);
  wherein the new data-set signal (332) is asserted when the data-set load complete signal (336) and the begin new PWM cycle signal (334) are both asserted.

4. The PWM generator according to claim 3, further comprising a digital processor and memory (450) for monitoring the master time base (300) and generating the data-set load complete signal (336) and the begin new PWM cycle signal (334).

5. The PWM generator according to claim 4, wherein the digital processor is a microcontroller.

6. The PWM generator according to claim 4, wherein the digital processor is a microprocessor.

7. The PWM generator according to claim 4, wherein the digital processor is a digital signal processor (DSP).

8. A system for generating a plurality of pulse width modulation (PWM) signals (350) that are synchronized with a master time base (300) and maintain PWM data-set coherency, said system comprising:
  a master time base generator (300), wherein the master time base generator (300) comprises:
    a master period register (304) storing a master period value;
    a master period counter (308) having a clock input coupled to a clock generating a plurality of clock pulses, and incrementing a master count value for each of the plurality of clock pulses received;
    a master period comparator (306) coupled to the master period register (304) and the master period counter (308), wherein the master period comparator (306) compares the master count value to the master period value, generates a PWM cycle start signal (348) when the master count value is equal to or greater than the master period value, and then resets the master count value in the master period counter (308) to zero; and
  a plurality of PWM generators (302) for generating a plurality of PWM signals (350) that are synchronized with the PWM cycle start signal (348) and maintain PWM data-set coherency, each of the plurality of PWM generators (302) comprises:
    a duty cycle register (310) storing a duty cycle value;
    a duty cycle counter (314) having a clock input coupled to the clock and incrementing a duty cycle count value for each of the plurality of clock pulses received;
    a duty cycle comparator (312) coupled to the duty cycle register (310) and the duty cycle counter (314), wherein the duty cycle comparator (312) compares the duty cycle count value to the duty cycle value, and generates a phase offset related PWM signal (350) when the duty cycle count value is less than or equal to the duty cycle value;
    a phase offset register (316) storing a phase offset value and coupled to the duty cycle counter (314), wherein the phase offset value is loaded into the duty cycle counter (314) to become a new duty cycle count value when the PWM cycle start signal (348) is asserted from the master time base (300);
    a duty cycle buffer register (320) coupled to the duty cycle register (310), wherein the duty cycle buffer register (320) stores a new duty cycle value;
    a phase offset buffer register (318) coupled to the phase offset register (316), wherein the phase offset buffer register (318) stores a new phase offset value;
  a master period buffer register (322) coupled to the master period register (304), wherein the master period buffer register (322) stores a new master period value; and
  logic for generating a new data-set signal (332) just before starting a next PWM cycle;
  wherein the new master period value replaces the master period value in the master period register (304), and the new duty cycle value replaces the duty cycle value and the new phase offset value replaces the phase offset value in each of the plurality of PWM generators (302) when the new data-set signal (332) is asserted.

9. The system according to claim 8, wherein the new data-set signal (332) is asserted when the PWM cycle start signal (348) is asserted from the master time base (300).

10. The system according to claim 8, wherein the logic for generating a new data-set signal (332) comprises:
  a first AND gate (326) having first and second inputs and an output, the first input is coupled to a data-set load complete signal (336);
  a D flip-flop (324) having a clock input coupled to the clock and a D-input coupled to the output of the first AND gate (326);
  a second AND gate (330) having a first input coupled to a Q-output of the D flip-flop (324), a second input coupled to a begin new PWM cycle signal (334) and an output for generating the new data-set signal (332); and
  an inverter having an input coupled to the output of the second AND gate (330) and an output coupled to the second input of the first AND gate (326);
  wherein the new data-set signal (332) is asserted when the data-set load complete signal (336) and the begin new PWM cycle signal (334) are both asserted.

11. The system according to claim 10, further comprising a digital processor and memory (450) for monitoring the master time base (300) and generating the data-set load complete signal (336) and the begin new PWM cycle signal (334).

12. The system according to claim 11, wherein the digital processor is a microcontroller.

13. The system according to claim 11, wherein the digital processor is a microprocessor.

14. The system according to claim 11, wherein the digital processor is a digital signal processor (DSP).

15. A method for generating a plurality of pulse width modulation (PWM) signals that are synchronized with a master time base and maintain PWM data-set coherency, said method comprising the steps of:
  storing a master period value in a master period register (304);
  incrementing a master count value in a master period counter (308) for each clock pulse received by the master period counter (308);

comparing the master count value to the master period value with a master period comparator (306);

generating a PWM cycle start signal when the master count value is equal to or greater than the master period value and then resetting the master count value to zero;

synchronizing a plurality of PWM generators (302) with the PWM cycle start signal, wherein each of the plurality of PWM generators (302) generates a PWM signal that is synchronized with the PWM cycle start signal and maintains PWM data-set coherency, operation of each of the plurality of PWM generators (302) comprises the steps of:

storing a duty cycle value in a duty cycle register (310);

incrementing a duty cycle count value in a duty cycle counter (314) for each clock pulse received by the duty cycle counter (314);

comparing the duty cycle count value to the duty cycle value with a duty cycle comparator (312);

generating a phase offset related PWM signal when the duty cycle count value is less than or equal to the duty cycle value;

storing a phase offset value in a phase offset register (316);

loading the phase offset value into the duty cycle counter (314) upon receiving the PWM cycle start signal, wherein the loaded phase offset value becomes a new duty cycle count value;

storing a new duty cycle value in a duty cycle buffer register (320);

storing a new phase offset value in a phase offset buffer register (318);

storing a new master period value in a master period buffer register (322);

generating a new data-set signal just before starting a next PWM cycle;

replacing the duty cycle value with the new duty cycle value and the phase offset value with the new phase offset value in each of the plurality of PWM generators (302) when the new data-set signal is asserted; and replacing the master period value with the new master period value when the new data-set signal is asserted.

16. The method according to claim 15, wherein the step of generating the new data-set signal comprises the step of generating the new data-set signal from the step of generating the PWM cycle start signal.

17. The method according to claim 15, further comprising a digital processor for providing the steps of:

storing the new master period value in the master period buffer register (322);

storing the new duty cycle value in the duty cycle buffer register (320);

storing the new phase offset value in the phase offset buffer register (318); and generating the new data-set signal.

18. The method according to claim 17, wherein the digital processor is a microcontroller.

19. The method according to claim 17, wherein the digital processor is a microprocessor.

20. The method according to claim 17, wherein the digital processor is a digital signal processor (DSP).

* * * * *